(12) United States Patent
Ambe

(10) Patent No.: US 6,684,494 B2
(45) Date of Patent: Feb. 3, 2004

(54) PARTS REPLACING METHOD AND PARTS REPLACING APPARATUS

(75) Inventor: Takeshi Ambe, Chiba (JP)

(73) Assignee: Sony Corporation, Tokyo (JP)

( * ) Notice: Subject to any disclaimer, the term of this patent is extended or adjusted under 35 U.S.C. 154(b) by 94 days.

(21) Appl. No.: 09/967,175

(22) Filed: Sep. 28, 2001

(65) Prior Publication Data

US 2002/0075661 A1 Jun. 20, 2002

(30) Foreign Application Priority Data

Oct. 2, 2000 (JP) .................................... P2000-302485

(51) Int. Cl.[7] ................................................ H05K 3/30
(52) U.S. Cl. ............................ 29/832; 29/739; 29/740; 29/743; 29/834; 29/839; 29/840; 29/843
(58) Field of Search .................... 29/832, 834, 840, 29/843, 743, 739, 740; 294/64.1; 901/40

(56) References Cited

U.S. PATENT DOCUMENTS 4,706,379 A * 11/1987 Seno et al. .................... 29/740
5,727,311 A * 3/1998 Ida et al. ...................... 29/832
5,809,639 A * 9/1998 Alvite .......................... 29/740
5,862,588 A * 1/1999 Heim et al. ................... 29/840
5,933,942 A * 8/1999 Kitamura et al. ............. 29/740

* cited by examiner

*Primary Examiner*—Carl J. Arbes
*Assistant Examiner*—Tai Nguyen
(74) *Attorney, Agent, or Firm*—Sonnenschein, Nath & Rosenthal LLP (57) ABSTRACT

An electronic parts replacing apparatus comprises: a holder for holding a piece of electronic parts to be replaced; a head detachably provided to the holder; and a guide bar for guiding the head to move close to or away from a circuit board. After holding the piece of electronic parts to be replaced on the circuit board by the holder and then integrating the head to the holder, the piece of electronic parts to be replaced are removed by moving the holder to a direction away from the circuit board. After removing the piece of electronic parts to be replaced from the holder and then holding a new piece of replacing electronic parts, the piece of replacing electronic parts are mounted on the circuit board by moving the head close to the circuit board.

7 Claims, 9 Drawing Sheets

PARTS REPLACING METHOD AND PARTS REPLACING APPARATUS

CROSS REFERENCES TO RELATED APPLICATIONS

The present invention claims priority to priority document No. P2000-302485 filed in Japan on Oct. 2, 2000, and incorporated by reference herein.

BACKGROUND OF THE INVENTION

1. Field of the Invention

This invention relates to a parts replacing method and a parts replacing apparatus for replacing electronic parts mounted on a substrate, and such parts are mainly electronic parts mounted on a printed circuit board to be installed in an electronic appliance.

2. Related Art

Generally, various kinds of electronic parts such as BGA (Ball Grid Array) elements are arranged on a mounting (circuit) board. In a manufacturing process for mounting various parts on the circuit board, sometimes, mounting defects are detected at some of mounted electronic parts through an inspection process usually done after mounting these electronic parts on the circuit board. In this case, it is necessary for such defectively mounted piece of electronic parts to be removed among plural electronic parts mounted on the circuit board, and to remount a new piece of electronic parts at the removed position of the circuit board.

Figure 13:
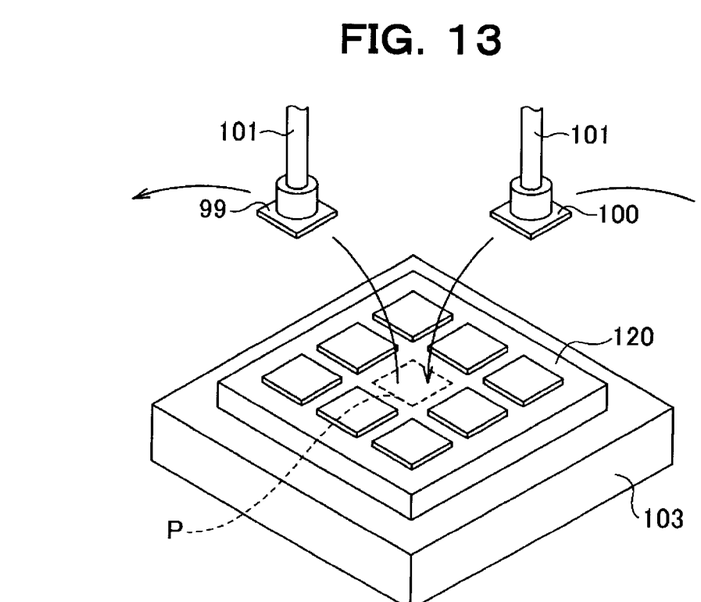
FIG. 13 is a chart for explaining a conventional electronic parts replacing method.

FIG. 13 shows one example of a conventional electronic parts replacing method for replacing defectively mounted a piece of parts to new piece. Conventionally, in an electronic parts mounting apparatus (such as called a chip mounter), a circuit board 120 is placed on a table 103 and a defectively mounted piece of electronic parts (here-in after called as a piece of electronic parts to be replaced) 99 is removed from the circuit board 120 by a work head 101, and after putting it away, a new piece of electronic parts (here-in after called as a piece of replacing electronic parts) 100 is picked up by the work head 101 and remounted on a position where the piece of electronic parts 99 to be replaced is mounted on the circuit board 120.

When such new piece of replacing electronic parts 100 is mounted after the piece of electronic parts 99 to be replaced is removed from the circuit board 120, it is necessary to mount the new piece 100 precisely on the right position where the piece of electronic parts 99 to be replaced is previously mounted. If the piece of replacing electronic parts 100 is mounted to a position where is slightly differed from the position of the removed piece of electronic parts 99 to be replaced, this causes again defective mount of the electronic parts.

Figure 14:
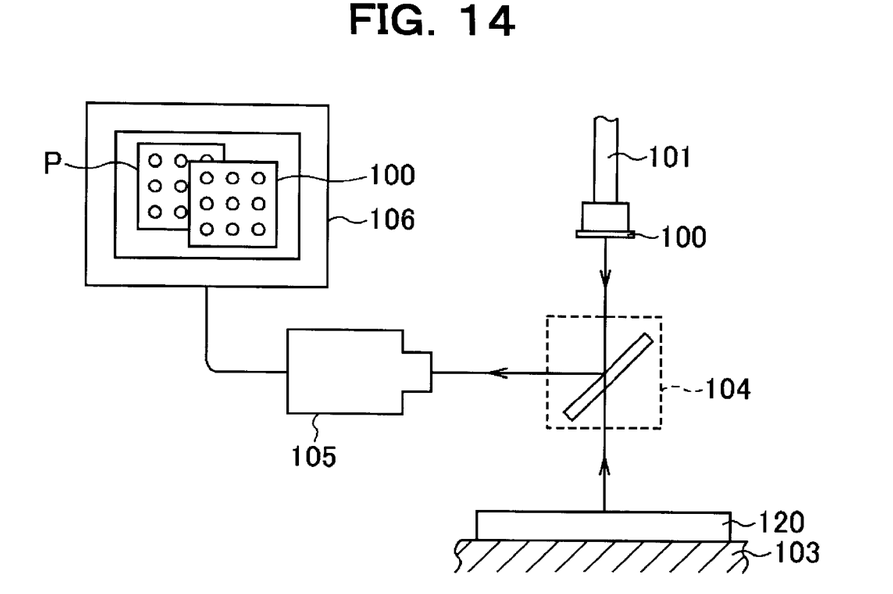
FIG. 14 is a chart for explaining one example of a positioning method carried by the conventional electronic parts replacing method.
Figure 15:
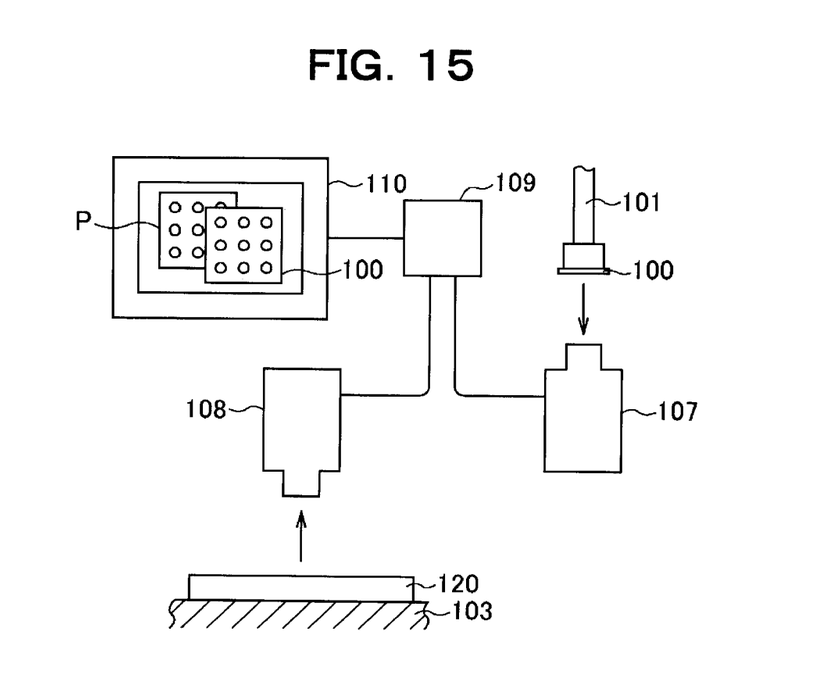
FIG. 15 is a chart for explaining another example of a positioning method carried by the conventional electronic parts replacing method.
Figure 16:
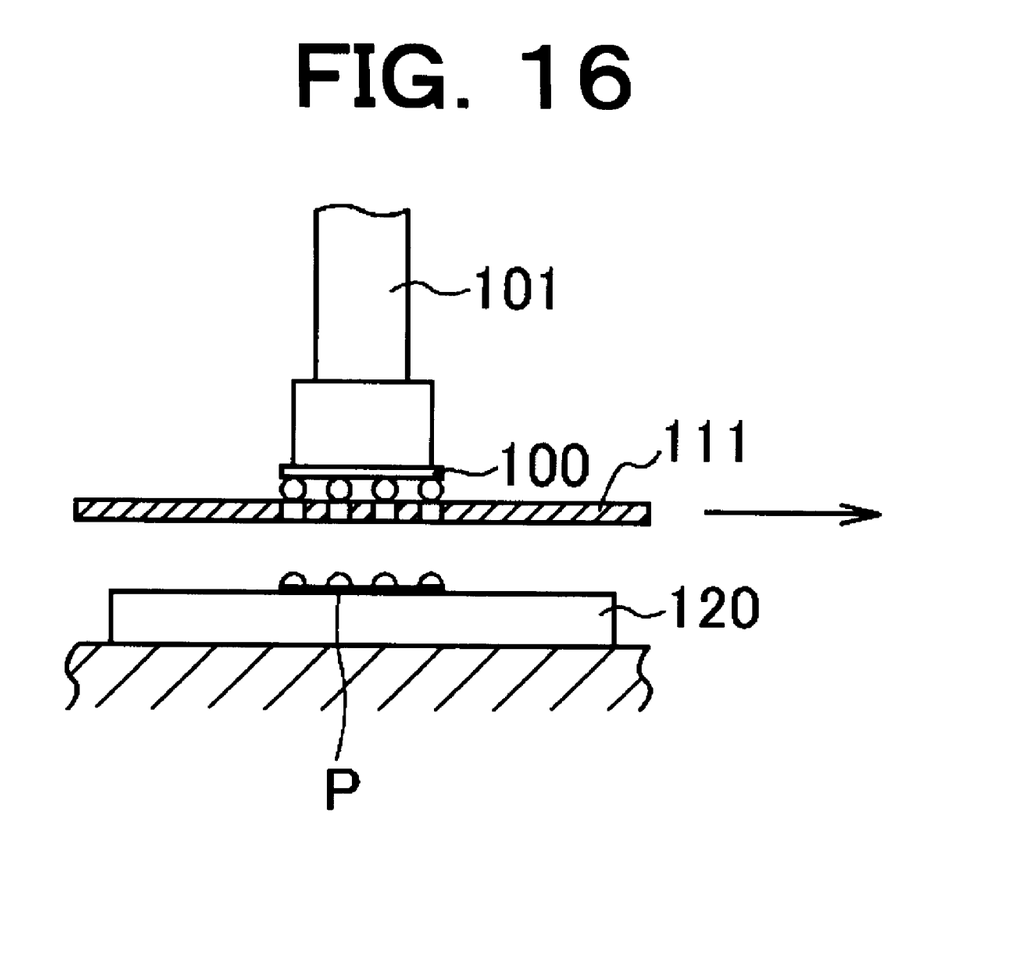
FIG. 16 is a chart for explaining further another example of a positioning method carried by the conventional electronic parts replacing method.

In order to precisely position the piece of replacing electronic parts 100 to the position where the piece of electronic parts 99 to be replaced are mounted, three kinds of methods as shown in FIG. 14 to FIG. 16 have been practiced conventionally.

In any of these conventional methods, the positioning of the replacing electronic parts 100 is done with reference to the pattern P that is provided on a position where the piece of electronic parts 99 to be replaced is previously mounted.

In the conventional method as shown in FIG. 14, the piece of replacing electronic parts 100 held by a work head 101 is positioned almost above the pattern P on the circuit board 120 and between the piece of replacing electronic parts 100 and the circuit board 120, an optical apparatus 104 is provided for superposing an image of the piece of replacing electronic parts 100 on an image of the pattern P, and the image obtained through the optical apparatus 104 is to be inspected using a CCD (Charge Coupling Device) camera 105.

An operator moves the work head 101 or the table 103 for the fine adjustment as to perfectly superpose the image of the piece of replacing electronic parts 100 and the image of the pattern P, while watching the monitor 106 connected to the CCD camera 105, and after that the operator moves the work head 101 downwardly for mounting the piece of replacing electronic parts 100 on the circuit board 120.

Further in the conventional method shown in FIG. 15, the image of the replacing electronic parts 100 and the image of the pattern P are obtained through two CCD cameras 107 and 108, these images are superposed by an image superposing apparatus 109 and then displayed on the monitor 110. The operator, while watching the monitor 110, moves the work head 101 (or table 103) for carrying out the fine adjustment so as to superpose the image of the piece of replacing electronic parts 100 and the image of the pattern P, and after that the operator moves the work head 101 down to mount the piece of replacing electronic parts 100 on the circuit board 120.

In addition in the conventional method shown in FIG. 16, a mask 111 having the same pattern as the pattern P on the circuit board 120 is provided above the table 103 where the circuit board 120 is placed. The operator, while watching the pattern P on the circuit board 120 and the mask 111, moves the table 103 for fine adjustment as to position the work head 101 on a predetermined position on the mask 111. After that, the mask 111 is removed between the piece of replacing electronic parts 100 and the circuit board 120 the work head 101 is moved downwardly, and the piece of replacing electronic parts 100 is mounted on the circuit board 120.

In accordance with the above-mentioned conventional methods as shown in FIG. 14 to FIG. 16, it is necessary to carry out the fine adjustment of the work head 101, so that the operator is required enough experience and further it takes much time to replace the electronic parts. Further in the above mentioned conventional methods shown in FIG. 14 and FIG. 15, various equipments such as CCD cameras, optical devices, an image superposing apparatus or a monitor are necessary, so that there exists another problem such as increase of manufacturing costs. In addition, according to the conventional method shown in FIG. 16, fine adjustments of the positioning for the work head are done with human eyes, so that when the electronic parts are aligned in very fine pitches, such adjustment work takes long times, or sometimes it becomes difficult to perform by human eyes.

SUMMARY OF THE INVENTION

A parts replacing method of the present invention preferably comprises the steps of: holding step for holding a piece of parts to be replaced mounted at a predetermined position of a substrate by a holding section of a parts holding means; removing step for removing the piece of parts to be replaced from the substrate by moving the parts holding means away from the substrate, while guiding the parts holding means by the guide means; replacing step for removing the piece of parts to be replaced from the holding section of the parts holding means and for attaching a piece of replacing parts to the holding section; and mounting step for mounting the piece of replacing parts held at the holding section by moving the parts holding means close to the substrate, while guiding the parts holding means by the guide means.

Further a parts replacing apparatus of the another aspect of the present invention comprises: a parts holding means having a holding section for holding a piece of parts to be replaced for removing the piece of parts to be replaced held at the holding section and for attaching to the holding section a new piece of replacing parts; and a guide means for guiding the parts holding means in the direction to move away from or close to a substrate.

According to the electronic parts replacing method or the electronic parts replacing apparatus, the piece of electronic parts to be replaced is removed from the substrate, while being guided by the guide means, after holding the piece of electronic parts to be replaced mounted on the substrate at the holding section. After that, the piece of electronic parts to be replaced is removed from the holding section of the electronic parts holding means, and then new piece of replacing electronic parts is attached to the holding section. Then the electronic parts holding means is moved toward the substrate, while being guided by the guide means, and after that the piece of replacing electronic parts held on the holding section is mounted on the substrate. The relative positional relation between the electronic parts holding means and the substrate is determined by the guide means, so that the piece of replacing electronic parts can be precisely mounted on the position of the piece of electronic parts to be replaced.

DETAILED DESCRIPTION OF THE PREFERRED EMBODIMENTS

A preferred embodiment of the present invention is explained with reference to the accompanying drawings.

[Construction of a Parts Replacing Apparatus]

Figure 1:
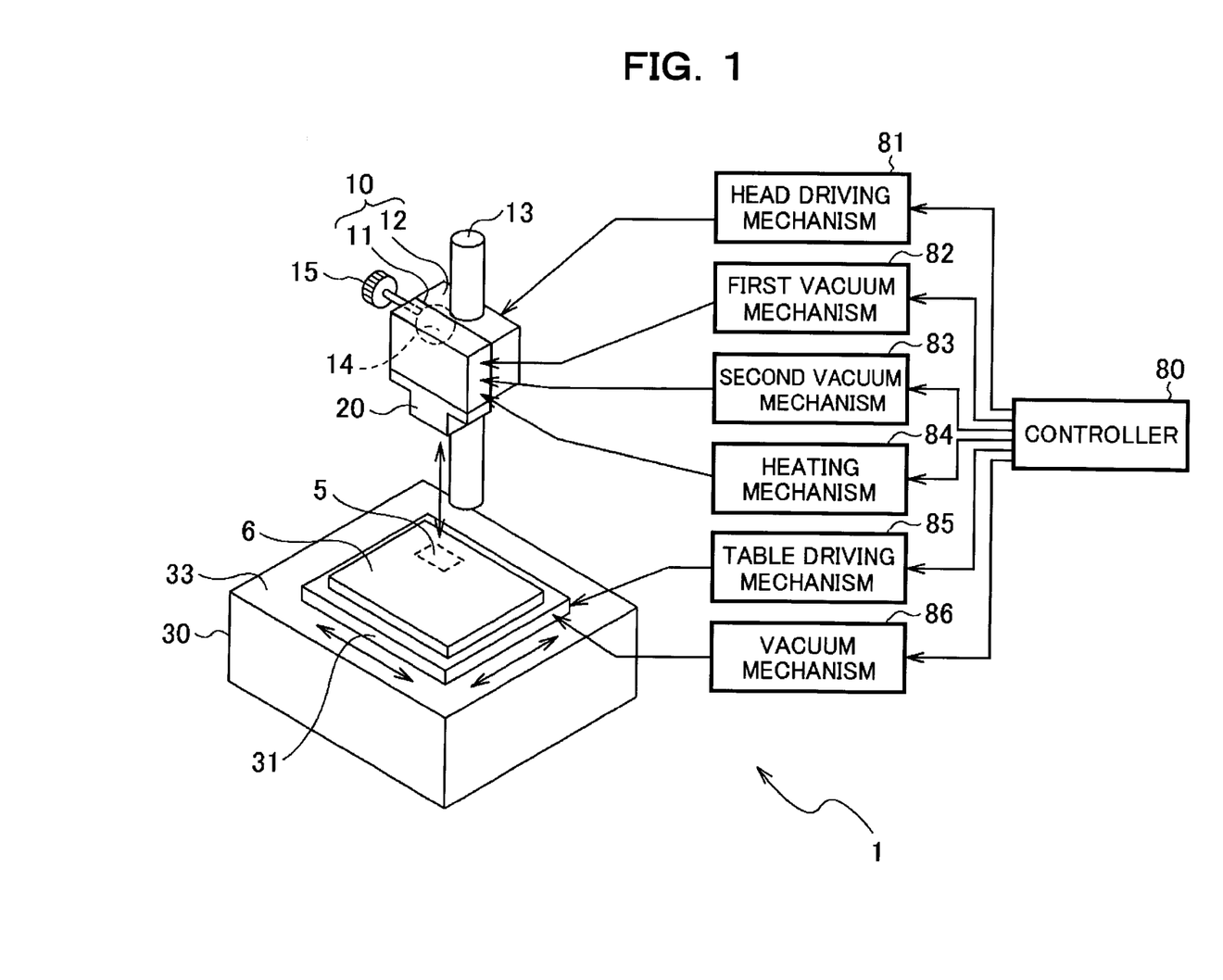
FIG. 1 is a perspective view for showing a basic construction of one embodiment for an electronic parts replacing apparatus according to the present invention.

FIG. 1 shows a basic construction of an electronic parts replacing apparatus 1 of the present invention. This electronic parts replacing apparatus 1 removes a defectively mounted piece of electronic parts from a circuit board 6 on which plural of electronic parts 5 such as BGA (Ball Grid Allay) elements are mounted, and then remount a new piece of electronic parts of the same one. In this specification, the circuit board 6 corresponds one of practical example of a [substrate] of the present invention.

The electronic parts replacing apparatus 1 has a rectangular-shaped base 30. This rectangular-shaped base 30 is placed on a floor or the like as for its top surface 33 of the rectangular-shaped base 30 to be flat. On the top surface 33 of the rectangular-shaped base 30, a flat-shaped XY table 31 is provided. The flat-shaped XY table 31 moves into two directions along with the top surface 33 of the rectangular-shaped base 30 by a table driving mechanism 85 comprised of a ball and screw mechanism, for example. Further the flat-shaped XY table 31 is so constructed as to put the circuit board 6 on the top surface 33 of the rectangular-shaped base 30. The flat-shaped XY table 31 has plural vacuum adsorption apertures, although not shown, and these vacuum adsorption apertures are connected to a vacuum mechanism 86. Accordingly when the vacuum mechanism 86 starts to conduct the vacuum suction, the flat-shaped XY table 31 can hold the circuit board 6 on the top surface 33. In this specification, the flat-shaped XY table 31 corresponds to a practical example of a [positioning means] of the present invention.

Above the base 30, a guide bar 13 extending in the vertical direction is provided. The guide bar 13 is supported by a bracket, although not shown, and a lower edge of the guide bar 13 is positioned to be higher than the top surface 33 of the base 30 by a predetermined amount. The guide bar 13 and the base 30 are arranged not to change the relative positional relation. On the guide bar 13, a block-shaped head 10 is supported slidably in the longitudinal direction (namely, in the vertical direction) of the guide bar 13. In this specification, the guide bar 13 corresponds to a practical example of a [guide means] of the present invention.

The head 10 is equipped with a block-shaped slide section 12 having a slide sleeve bearing and a head base 11 attached to the block-shaped slide section 12. The head base 11 is so constructed as to perform a fine adjustment of its fixing angle relative to the block-shaped slide section 12. Accordingly, the head base 11 is so constructed as to able to move within a predetermined angle around the looper driving ball stud 14 that is extending perpendicular to an elongated direction of the guide bar 13 against the slide section 12. The head 10 carries a lock handle 15 for suppressing the rocking motion of the head base 11 around the looper driving ball stud 14. This lock handle 15 is rotated by hand, for example, and is able to lock the positioning angle of the head base 11.

The head 10 is further arranged to move along with the guide bar 13 in the vertical direction by a head driving mechanism 16 comprised of, for example, a ball and screw mechanism or the like. Thereby the head 10 is arranged to move close to or away from the circuit board 6 that is supported on the flat-shaped XY table 31.

Figure 2:
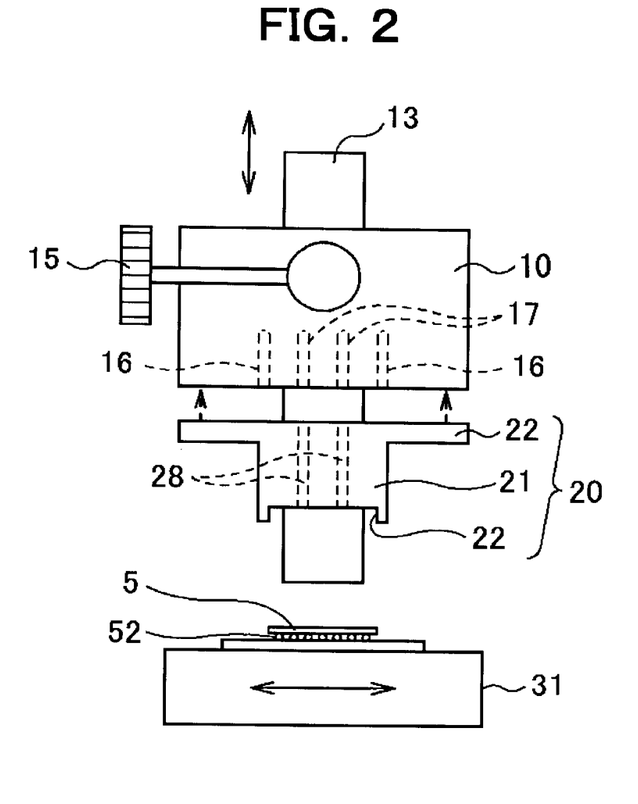
FIG. 2 is an enlarged view for showing a part of the basic construction of the embodiment of the electronic parts replacing apparatus shown in FIG. 1.

FIG. 2 shows an enlarged view of a relevant part of the electronic parts replacing apparatus 1 shown in FIG. 1. The head 10 has first vacuum adsorbing apertures 16 open towards a bottom surface (namely a bottom surface opposing to the base 30). These first vacuum adsorbing apertures 16 are connected via connection part, although not shown, to a first vacuum mechanism 82. The head 10 executes the vacuum suction by the first vacuum mechanism 82 via the first vacuum adsorbing apertures 16, and is to be integrated with a holder 20 by adsorbing the holder 20.

In addition, the head 10 has second vacuum adsorbing apertures 17 opened towards its bottom surface. These second vacuum adsorbing apertures 17 are connected via connection part, although not shown, to a second vacuum mechanism 83. The head 10 executes the vacuum suction by the second vacuum mechanism 83 via the first vacuum adsorbing apertures 17, and is to hold a piece of electronic parts 5 via the holder 20.

Further the head 10 includes a heater, although not shown, and the heater is connected to a heating mechanism 84 provided outside of the head 10. The head 10 is heated by the heating mechanism 84, and the solder 52, that is used for soldering the electronic parts 5 to the circuit board 6, is softened by the heater by way of the holder 20.

Figure 3:
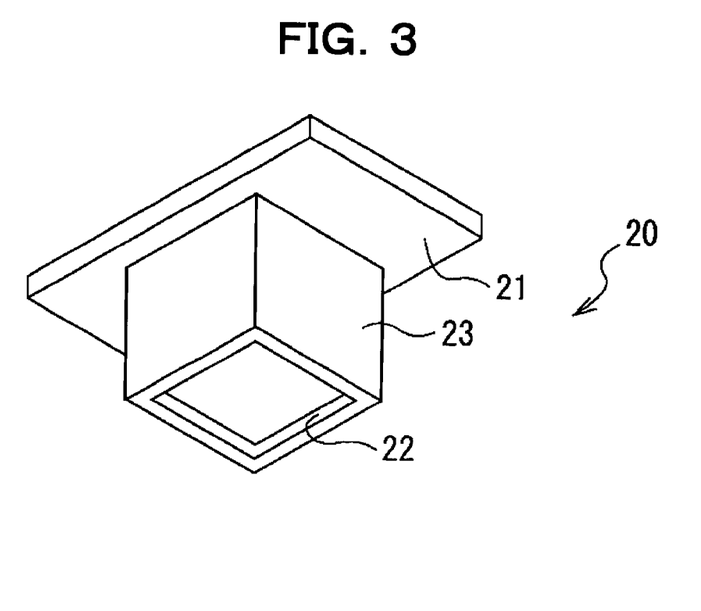
FIG. 3 is a perspective view of a holder of the electronic parts replacing apparatus.

The holder 20 for holding the electronic parts 5 is attached to a bottom surface of the head base 11 on the head 10. FIG. 3 shows an outer shape of the holder 20. The holder 20 has a rectangular-shaped middle section 23 and a flange section 21 formed on the middle section 23 (the head 10 side), and a piece of parts 5 is held by the head 10 at this flange section 21 by adsorption.

Further below the rectangular-shaped middle section 23, there is formed a holding section 22 as a hollow section. The holding section 22 has a shape as to surround an outer periphery of the piece of electronic parts 50 to be replaced and the positioning of the electronic parts 5 is to be done within the holding section 22. The depth of the holding section 22 is set to be slightly thinner than the thickness of the piece of the electronic parts 5. As will be described later, this is because the piece of electronic parts 5 has to be pressed against the circuit board 6. Here, the head 10 and the holder 20 correspond to one example of a [parts holding means] of the present invention.

The holder 20 further includes vacuum adsorbing apertures 28 passing through from a top surface of the holder 20 to the holding section 22. This vacuum adsorbing apertures 28 are formed so as to communicate with the second vacuum adsorbing apertures 17 under the condition where the head 10 and the holder 20 are integrated to each other. Namely by the second vacuum mechanism 83, it becomes possible to adsorb and hold the piece of electronic parts 5 by way of the second vacuum adsorbing apertures 17 of the head 10 and the vacuum adsorbing apertures 28 of the holder 20 by the vacuum adsorption.

As shown in FIG. 1, the head driving mechanism 81, the first vacuum mechanism 82, the second vacuum mechanism 83, the heating mechanism 84, the table driving mechanism 85 and the vacuum mechanism 86 are driven and controlled by a controller 80 comprised of a computer, for example. But, actual operation of respective mechanism 81, 86 may be carried out in accordance with previously programmed sequences, or may be carried out in response to the operation of the operation button by the operator.

[An Electronic Parts Replacing Method]

Figure 4:
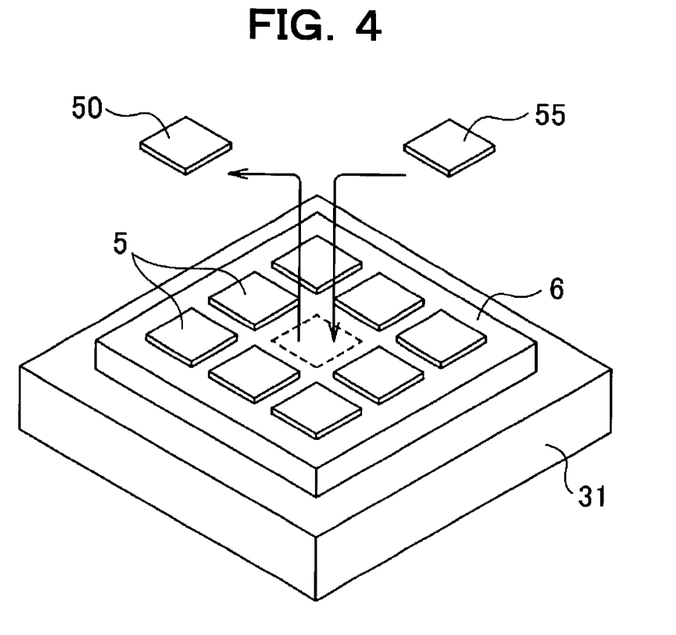
FIG. 4 is a perspective view for explaining an electronic parts replacing method of another embodiment of the present invention.

Next a method for replacing a piece of electronic parts mounted on the circuit board 6 by applying the electronic parts replacing apparatus 1 as shown in FIG. 1 to FIG. 3. As shown in FIG. 4, among the electronic parts 5 mounted on the circuit board 6 secured to the flat-shaped XY table 31, a defectively mounted piece of electronic parts (here-in-after referred to as a piece of electronic parts 50 to be replaced) is removed, and a new piece 55 of the same electronic parts (here-in-after referred to as a piece of replacing electronic parts 55) is remounted.

Figure 5:
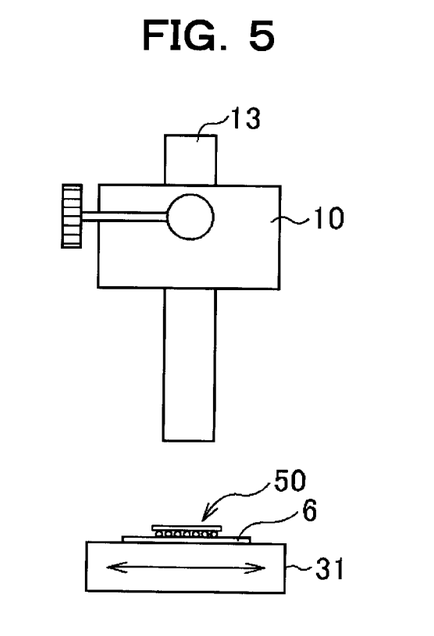
FIG. 5 is a chart for explaining one of processes of the electronic parts replacing method using the electronic parts replacing apparatus as shown in FIG. 1.

FIG. 5 to FIG. 12, inclusive, show an electronic parts replacing method using the electronic parts replacing apparatus 1 on a process by process. At first as shown in FIG. 5, the flat-shaped XY table 31 is moved by the table driving mechanism 85 so that the piece of electronic parts 50 to be replaced is positioned at below the head 10. In this case the holder 20 is not attached to the head 10.

Figure 6:
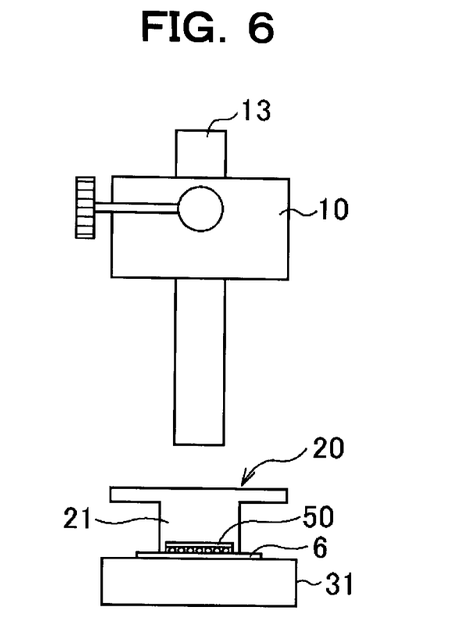
FIG. 6 is a chart for explaining a process followed by the process shown in FIG. 5.

Then as shown in FIG. 6, the operator operates the holder 20 to cover the piece of electronic parts 50 to be replaced on the circuit board 6, and accept the piece of electronic parts 50 to be replaced to the holding section 22 of the holder 20. This may be manually done by the operator, but may be done by some apparatus.

Figure 7:
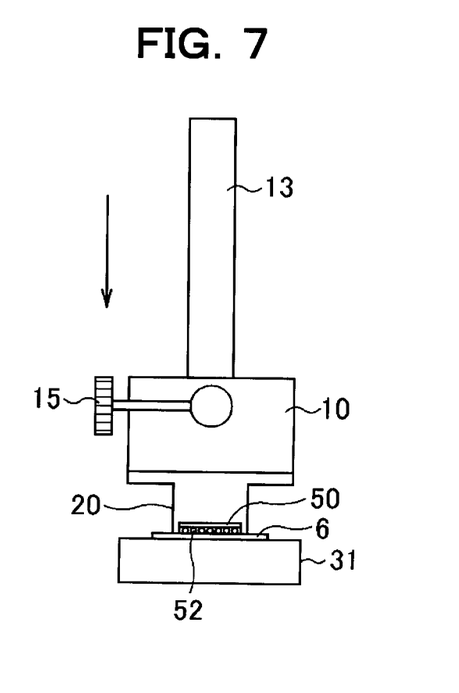
FIG. 7 is a chart for explaining a process followed by the process shown in FIG. 6.

After that as shown in FIG. 7, the head 10 is moved downwardly (towards the circuit board 6) so as for the bottom surface of the head base 11 to be contacted to the holder 20 by driving the driving mechanism 81. In this case, the operator preferably operates the lock handle 15, in advance, to make the head base 11 to be freely movable around the axis 14. Thereby even if the holder 20 is inclined, the head base 11 is also inclined following with the holder 20, so that the head base 11 is contacted with the holder 20. Then the holder 20 is adsorbed to the head 10 by the first vacuum adsorbing apertures 16 of the head 10 by operating the first vacuum mechanism 82. Thereby the head 10 and the holder 20 are integrated to each other.

Further a heater included in the head 10, although not shown, is heated by a heating mechanism 84. The heat of the heater in the head 10 is transferred to the solder 52 between the piece of electronic parts 50 to be replaced and the circuit board 6 via the holder 20, and thereby the solder 52 is softened. By softening the solder 52 that is fixing the piece of electronic parts 50 to be replaced to the circuit board 6, the piece of electronic parts 50 to be replaced is made removable from the circuit board 6.

The piece of electronic parts 50 to be replaced within the holding section 22 is held by the vacuum adsorption through the second vacuum adsorbing apertures 17 of the head 10 and the vacuum adsorbing apertures 28 of the holder 20 by driving the second vacuum mechanism 83. Thereby the head 10, the holder 20 and the piece of electronic parts 50 to be replaced are integrated to each other.

Figure 8:
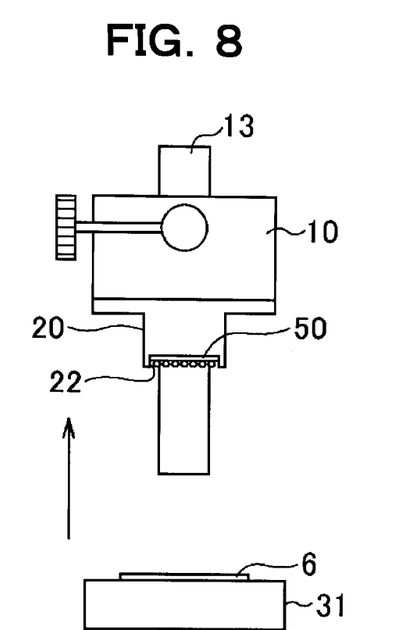
FIG. 8 is a chart for explaining a process followed by the process shown in FIG. 7.

Further as shown in FIG. 8, the head 10 is moved upwardly (namely in the direction away from the circuit board 6) by driving the head driving mechanism 81. During this time, the vacuum suction by the first vacuum mechanism 82 and the second vacuum mechanism 83 is kept continued, but the heating by the heating mechanism 84 is stopped. Thereby the holder 20 and the piece of electronic parts 50 to be replaced integrated to the head 10 move upwardly, and thereby the piece of electronic parts 50 to be replaced is separated from the circuit board 6.

Figure 9:
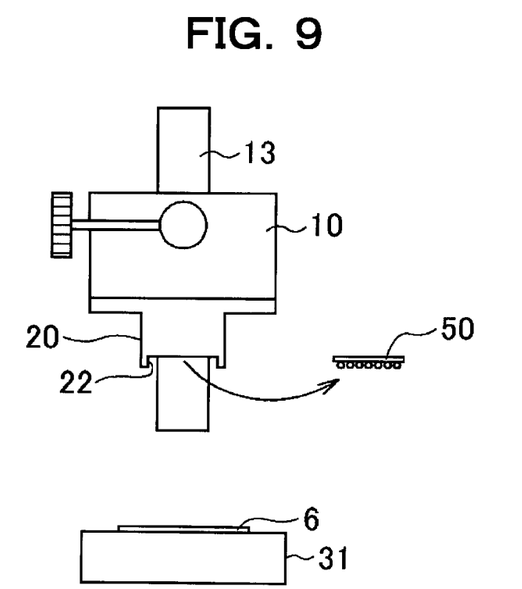
FIG. 9 is a chart for explaining a process followed by the process shown in FIG. 8.

After the temperature of the piece of electronic parts 50 to be replaced held at the holding section 22 of the holder 20 goes down to a temperature that does not affect the working, the operator stops the vacuum suction by the second vacuum mechanism 83 and removes the piece of electronic parts 50 to be replaced. This may be manually done by the operator or may be done by some other apparatus.

Figure 10:
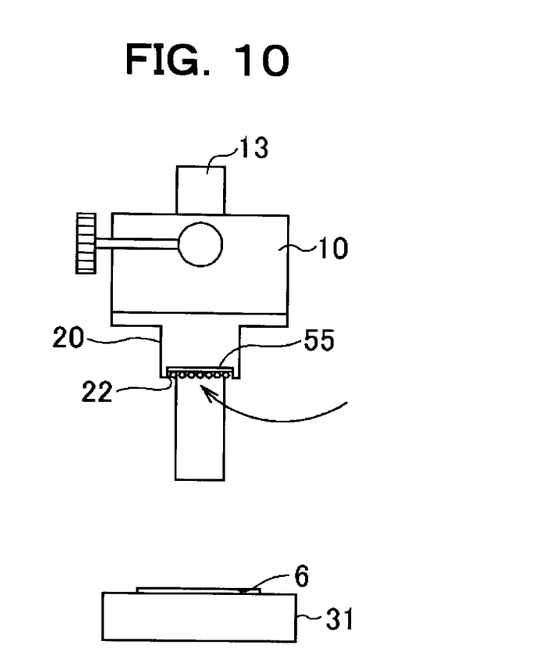
FIG. 10 is a chart for explaining a process followed by the process shown in FIG. 9.

Further as shown in FIG. 10, the operator operates the holding section 22 of the holder 20 to hold the piece of replacing electronic parts 55, and simultaneously the vacuum suction by the second vacuum mechanism 83 is started. Thereby the piece of replacing electronic parts 55 is held at the holding section 22 of the holder 20 by the vacuum suction of the second vacuum adsorbing apertures 17 of the head 10 and the vacuum adsorbing apertures 28 of the holder 20.

Figure 11:
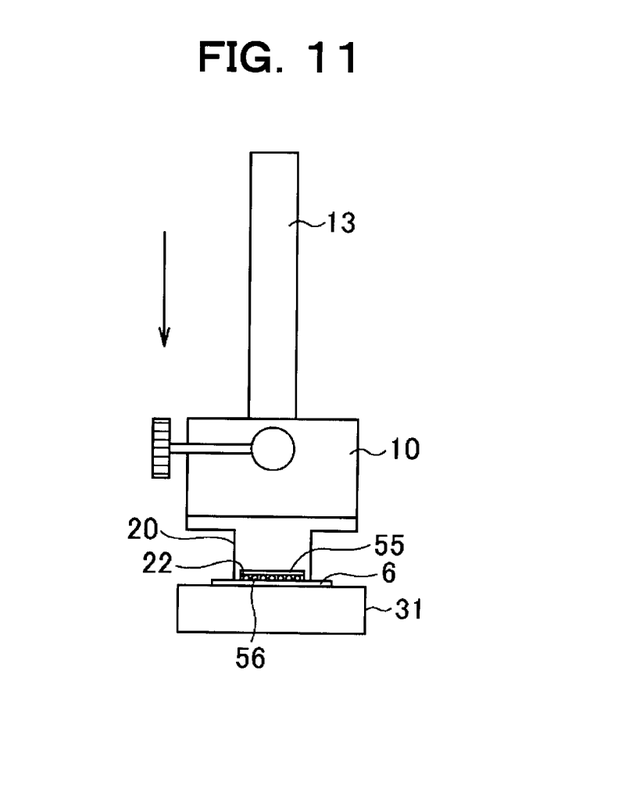
FIG. 11 is a chart for explaining a process followed by the process shown in FIG. 10.

After that as shown in FIG. 11, the head 10 is moved downwardly by driving the head driving mechanism 81, and the piece of replacing electronic parts 55 held at the holding section 22 of the holder 20 is depressed against the circuit board 6.

In this case, a relative positional relation of the head 10, the holder 20 and the circuit board 6 within a lateral plane is not changed at the time when the piece of electronic parts to be replaced is removed, so that the piece of replacing electronic parts 55 is precisely positioned right on the place where the piece of electronic parts 50 to be replaced is previously mounted.

Then the heater in the head 10 is heated by the heating mechanism 84. The heat of the heater in the head 10 is transferred to the solder 56 of the piece of replacing electronic parts 55 by way of the holder 20, and the solder 56 is softened. Then the heating by the heating mechanism 84 is stopped and the piece of replacing electronic parts 55 is fixed on the circuit board 6. After the piece of replacing electronic parts 55 is fixed on the circuit board 6, the vacuum suction by the second vacuum mechanism 83 is stopped. Then the holder 20 can be separated from the piece of replacing electronic parts 55 by stopping the vacuum suction of the second vacuum mechanism 83.

Figure 12:
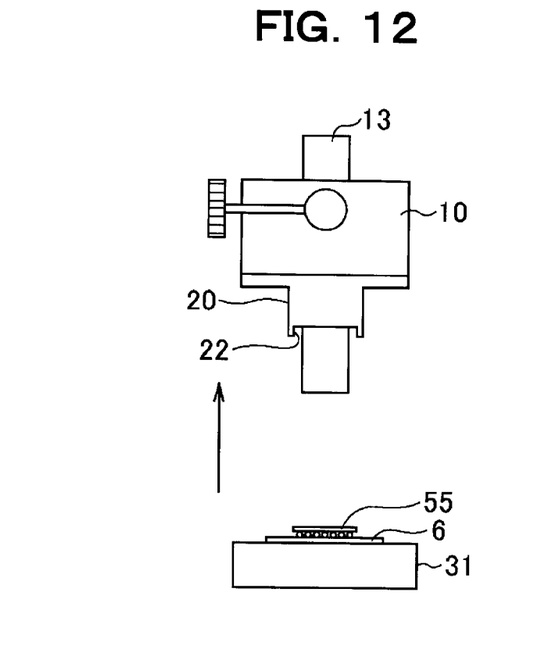
FIG. 12 is a chart for explaining a process followed by the process shown in FIG. 11.

Further as shown in FIG. 12, the head 10 is moved upwardly by the head driving mechanism 81, and thereby the replacement of the electronic parts using the electronic parts replacing apparatus 1 is completed, and the piece of replacing electronic parts 55 is precisely mounted on the position where the piece of electronic parts 50 to be replaced on the circuit board 6.

As described above, according to the embodiment of the parts replacing apparatus and the parts replacing method of the present invention, while maintaining the relative positional relation of the head 10, the holder 20 and the circuit board 6 within a lateral plain, the removal of the piece of electronic parts 50 to be replaced and the remounting of the piece of replacing electronic parts 55, so that the piece of replacing electronic parts 55 can be precisely remounted on the place where the piece of electronic parts 50 to be replaced is mounted on the circuit board 6.

In addition, as the holding section 22 provided at the holder 20 is so constructed as to engage with the piece of electronic parts 50 to be replaced and the piece of replacing electronic parts 55 from outside, and accordingly the relative position of the piece of electronic parts 50 to be replaced to the holder 20 and the relative position of the piece of replacing electronic parts 55 to the holder 20 become the same.

Further as the holder 20 and the head 10 are separately provided at first and are integrated to each other after holding the piece of electronic parts 50 to be replaced by the holder 20, and accordingly there causes no affect in the positioning accuracy for mounting the piece of replacing electronic parts 55, even if there exists a little positional dislocation between the head 10 and the holder 20. Namely in the process shown in FIG. 5, even if the flat-shaped XY table 31 is positioned relative to the head 10 with relatively rough accuracy, the piece of replacing electronic parts 55 can be mounted to the right position.

Further the holder 20 and the head 10 are integrated to each other by applying the vacuum adsorption, so that the construction for integrating the holder 20 and the head 10 can be simplified. In addition in the holder 20, the piece of electronic parts 50 to be replaced and the piece of replacing electronic parts 55 are held by the vacuum adsorption, so that the works for removing the piece of electronic parts 50 to be replaced from the holder 20 and mounting the piece of replacing electronic parts 55 are greatly simplified.

Further the solder 56 of piece of the electronic parts 50 to be replaced and the piece of replacing electronic parts 55 are softened by heating through the holder 20 with the heater provided at the head 10 and the heating mechanism 84, there is no problem such as a camber of the circuit board 6 existed in the conventional method where the heating process is done from the circuit board 6 side.

As described above, the present invention is explained with reference to the embodiment shown in the attached drawings, but the scope of the invention is not limited to the attached embodiment. For example, this invention is applied not only for exchanging the BGA elements as shown in this embodiment, but also for exchanging various types of electronic parts.

Further in the above mentioned embodiment, the electronic parts 50 to be replaced or the replacing electronic parts 55 are preferably held at the holder 20 by utilizing the vacuum adsorption method, but other method such as, for example, a magnetic adsorption method, a mechanical chucking method or the like may be employed instead of the vacuum adsorption method. In addition, the head 10 and the holder 20 may be integrated to each other by a method other than the vacuum adsorption method.

Further in the above embodiment, the head 10 is moved towards or away from the circuit board 6 on the flat-shaped XY table 31, but the flat-shaped XY table 31 can be moved towards or away from the head 10, instead. In addition, instead of moving the flat-shaped XY table 31 in a lateral plane, the head 10 may be moved in the lateral plane. The heater may be provided on the flat-shaped XY table 31 instead of providing the heater on the head 10.

What is claimed is:

1. A parts replacing method comprising the steps of:
   a positioning step in which a holding section of a parts holding means is positioned over a part to be replaced located on a substrate and in which guide means are positioned relative to the substrate;
   a chucking step in which a part holding chuck is positioned on the part to be replaced;
   an alignment step in which the holding section and chuck are aligned and oriented for proper coupling by adjustment of their relative positions, if necessary;
   a holding step in which said part holding chuck is held by said parts holding means and said part to be replaced is held by said part holding chuck;
   a removing step in which said part to be replaced is removed from said substrate by moving said parts holding means away from said substrate, while said parts holding means is guided along a path of travel by guide means;

a replacing step in which said part to be replaced is removed from said part holding chuck and in which a replacement part is then held by part holding chuck and said part holding chuck is held by said holding section of said parts holding means; and a mounting step in which said replacement piece held by said part holding chuck is moved closer to said substrate, while said parts holding means is guided along a path of travel by said guide means.

2. The parts replacing method as cited in claim 1, wherein said parts holding section of said parts holding means includes:

a slide block guided by said guide means; and a base head having said holding section, said base head being rotatable relative to said slide block.

3. The parts replacing method as cited in claim 2, wherein, said holding step includes:

a step for coupling together said holding chuck holding said part to be replaced and said holding section;

and said removing step includes:

a step of moving said holding section and holding chuck away from said substrate along said guide means.

4. The parts replacing method as cited in claim 1, wherein said holding section of said parts holding means includes a configuration capable of engaging with said part to be replaced.

5. The parts replacing method as cited in claim 1, wherein said parts holding means holds said part to be replaced by vacuum adsorption in said removing step.

6. The parts replacing method as cited in claim 1, wherein when said part to be replaced is fixed by solder to said substrate, and said solder is softened by heating means in said removing step and said mounting step.

7. The parts replacing method as cited in claim 1, further comprising:

a positioning step for adjusting the relative position of said parts holding means and said part to be replaced in a plane perpendicular to a direction of the relative movement of said parts holding means and said part to be replaced before said holding step.

* * * * *